United States Patent
Murayama et al.

(10) Patent No.: US 8,018,368 B2
(45) Date of Patent: Sep. 13, 2011

(54) A/D CONVERTER

(75) Inventors: Shigemitsu Murayama, Nagasaki (JP); Yasuhide Shimizu, Nagasaki (JP); Hiroaki Yatsuda, Nagasaki (JP); Kohei Kudo, Nagasaki (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/662,025

(22) Filed: Mar. 29, 2010

(65) Prior Publication Data
US 2010/0271244 A1     Oct. 28, 2010

(30) Foreign Application Priority Data
Apr. 23, 2009    (JP) .................................. 2009-105287

(51) Int. Cl.
*H03M 1/12* (2006.01)
(52) U.S. Cl. ....................................... 341/156; 341/155
(58) Field of Classification Search .................. 341/156, 341/155, 141, 161, 150, 154, 159, 162, 163, 341/166, 124, 142, 158, 120
See application file for complete search history.

(56) References Cited

U.S. PATENT DOCUMENTS
6,570,523 B1 * 5/2003 Bacrania et al. .............. 341/155
* cited by examiner

*Primary Examiner* — Joseph Lauture
(74) *Attorney, Agent, or Firm* — Rader, Fishman & Grauer PLLC (57) ABSTRACT

An analog to digital converter includes: a reference circuit adapted to generate reference voltages; differential amplifiers; normal phase circuits each of which samples a normal phase analog input signal and transfers a comparison voltage, obtained by comparison with a reference voltage generated by the reference circuit, to a first input terminal of one of the differential amplifiers when the input is differential and single-ended; and reversed phase circuits each of which samples a reversed phase analog input signal and transfers a comparison voltage, obtained by comparison with a reference voltage generated by the reference circuit, to a second input terminal of one of the differential amplifiers when the input is differential and which samples a ground level as a reference voltage of the reference circuit and supplies the reference voltage and comparison voltage to the second input terminal of the differential amplifier when the input is single-ended.

19 Claims, 11 Drawing Sheets

SINGLE-ENDED INPUT EVALUATION RESULTS (NEW CONFIGURATION)

OUTPUT HISTOGRAM WHEN SINE WAVE IS SUPPLIED TO INPUT
TEG916: HISTOGRAM WITH SINGLE-ENDED INPUT (fs=85MS/s)

(PERCENTAGE OF OCCURRENCE OF ODD CODES:PERCENTAGE OF OCCURRENCE OF EVEN CODES)=(50%:50%)

PROPER OUTPUT CODES

FIG. 11

SINGLE-ENDED INPUT EVALUATION RESULTS(RELATED ART)

OUTPUT HISTOGRAM WHEN SINE WAVE IS SUPPLIED TO INPUT
TEG915:HISTOGRAM WITH SINGLE-ENDED INPUT(fs=85MS/s)

(PERCENTAGE OF OCCURRENCE OF ODD CODES:PERCENTAGE OF OCCURRENCE OF EVEN CODES)=(27%:73%)

ERRORS IN OUTPUT CODES

US 8,018,368 B2

A/D CONVERTER

BACKGROUND OF THE INVENTION

1. Field of the Invention

The present invention relates to an A/D converter applicable both as a serial and serial/parallel A/D converter.

2. Description of the Related Art

Two A/D conversion methods, parallel and serial/parallel A/D conversion, are known as the most suitable methods for achieving fast analog to digital (A/D) conversion.

A parallel A/D converter includes a reference circuit and comparator group. The reference circuit supplies reference voltages for N bits during conversion of an analog input voltage to an N-bit digital signal. The comparator group compares the reference voltages from the reference circuit with the analog input voltage.

A parallel A/D converter further includes an encoding section and a timing generator. The encoding section converts the analog signal to a digital signal. The timing generator controls all the timings.

Figure 1:
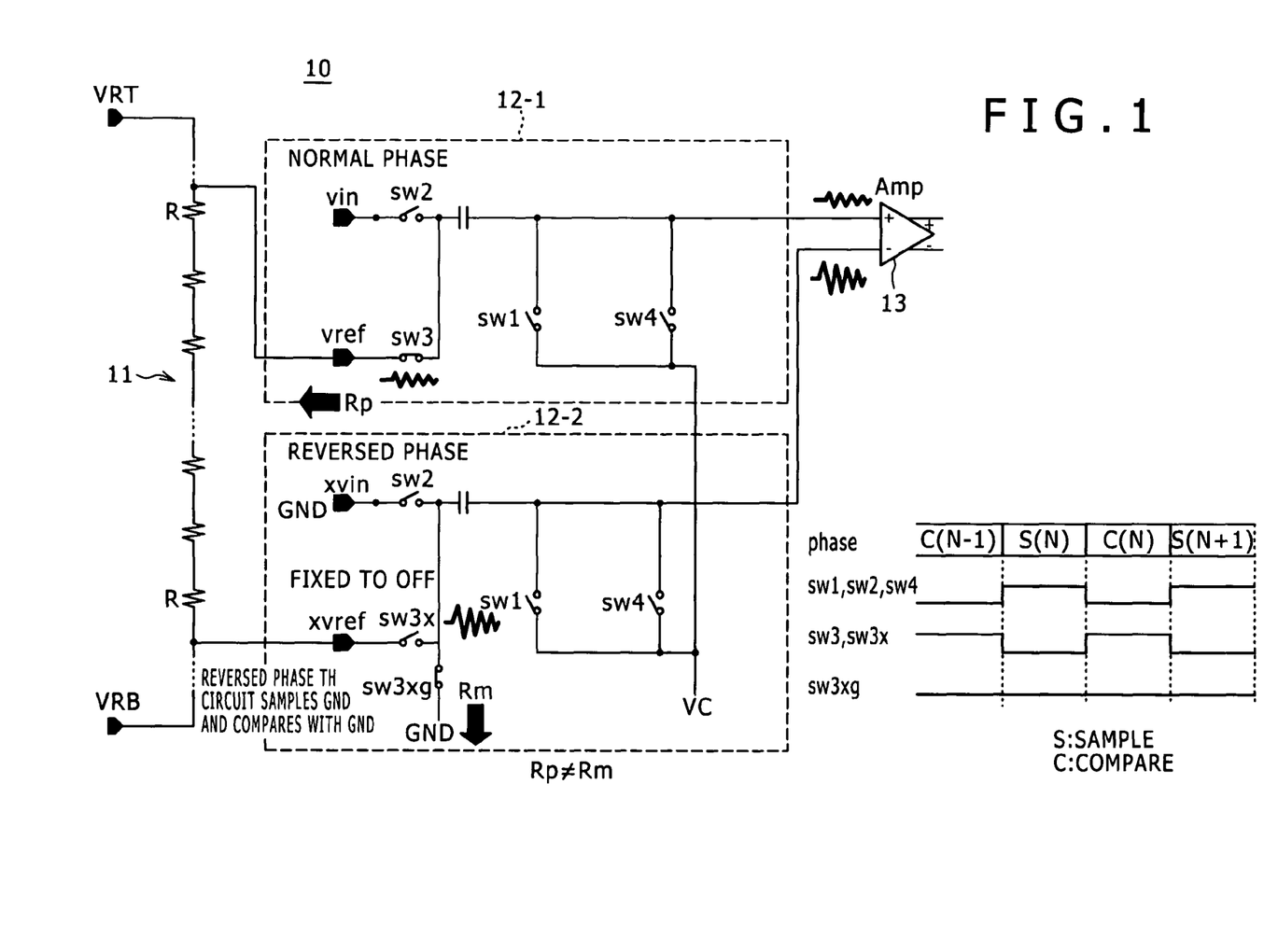
FIG. 1 is a circuit diagram illustrating part of a reference circuit and comparator group of a parallel A/D converter.

FIG. 1 is a circuit diagram illustrating part of the reference circuit and comparator group of a parallel A/D converter.

FIG. 1 shows that the input is single-ended.

A parallel A/D converter 10 shown in FIG. 1 includes a reference circuit 11 and a comparator group, i.e., a normal phase track-and-hold (TH) circuit 12-1, reversed phase TH circuit 12-2 and differential amplifier 13.

The reference circuit 11 includes a resistor ladder made up of a plurality of resistors R connected in series between high- and low-potential power sources VRT and VRB.

When the input is differential, the normal phase TH circuit 12-1 of the parallel A/D converter 10 samples an analog input signal vin by turning ON only switches sw1, sw2 and sw4.

Next, only a switch sw3 turns ON (together with a sw5 in FIG. 2 which will be described later) to transfer a comparison voltage, obtained by comparison with the reference voltage from the reference circuit 11, to the differential amplifier 13 at the subsequent stage.

As with the normal phase TH circuit 12-1, the reversed phase TH circuit 12-2 also samples an analog input signal xvin and transfers a comparison voltage, obtained by comparison with the reference voltage from the reference circuit 11, to the differential amplifier 13 at the subsequent stage.

When the input is single-ended, the reversed phase TH circuit 12-2 of the parallel A/D converter 10 samples a given fixed ground GND and transfers the reference voltage (GND) and comparison voltage to the differential amplifier 13 at the subsequent stage.

Figure 2:
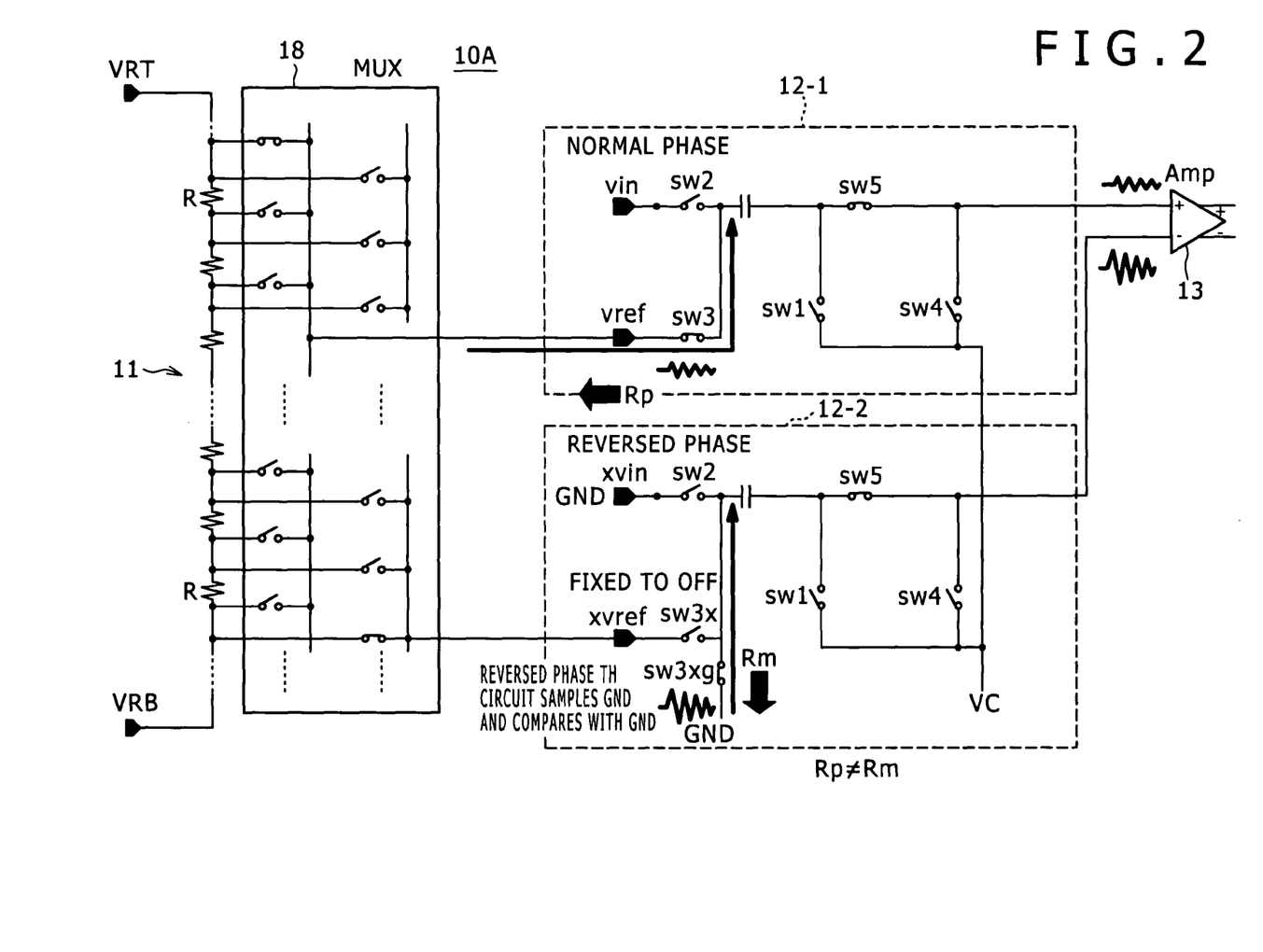
FIG. 2 is a circuit diagram illustrating part of the reference circuit and comparator group of a serial/parallel A/D converter.

FIG. 2 is a circuit diagram illustrating part of the reference circuit and comparator group of a serial/parallel A/D converter.

FIG. 2 also shows that the input is single-ended.

A serial/parallel A/D converter 10A basically includes a multiplexer 18 in addition to the components of the parallel A/D converter 10. The multiplexer 18 is made up of a group of switches.

SUMMARY OF THE INVENTION

In the parallel and serial/parallel A/D converters described above, when the input is single-ended, the normal phase TH circuit 12-1 samples an input signal and compares the input signal with the reference voltage from the reference circuit 11.

In contrast, the reversed phase TH circuit 12-2 samples the ground GND and compares the ground GND with the ground GND level using a separate switch sw3xg without using the reference circuit 11.

This leads to a difference in frequency band during comparison between the normal and reversed phase TH circuits 12-1 and 12-2.

If noise from the power source or reference circuit 11 finds its way into the TH circuits, the noise propagates in a different manner in the two TH circuits 12-1 and 12-2 before reaching the differential amplifier 13 at the subsequent stage. As a result, the differential amplifier 13 is unable to eliminate the noise when operating at high speed. During high-speed operation, the noise does not converge, thus leading to degraded performance of the AD converter.

That is, in the common A/D converters 10 and 10A, the normal and reversed phase TH circuits are connected to different reference inputs during comparison.

This leads to a difference in impedance (frequency band), causing the noise to propagate in a different manner in the two TH circuits and resulting in degraded accuracy during high-speed operation.

It is desirable to provide an A/D converter which ensures propagation of noise in the same manner in the normal and reversed phase circuits during comparison for cancellation of common mode noise in the differential amplifier so as to prevent accuracy degradation even during high-speed operation.

An A/D converter according to an embodiment of the present invention includes a reference circuit, differential amplifiers and normal and reversed phase circuits. The reference circuit generates reference voltages. The normal phase circuit samples a normal phase analog input signal and supplies a comparison voltage, obtained by comparison with the reference voltage generated by the reference circuit, to a first input terminal of one of the differential amplifiers when the input is single-ended and differential. The reversed phase circuit samples a reversed phase analog input signal and supplies a comparison voltage, obtained by comparison with the reference voltage generated by the reference circuit, to a second input terminal of the differential amplifier when the input is differential. Further, the reversed phase circuit samples a ground level as a reference voltage of the reference circuit and supplies the reference voltage and comparison voltage to the second input terminal of the differential amplifier when the input is single-ended. The reference circuit includes normal and reversed phase resistor ladders, each made up of a plurality of resistors. The normal and reversed phase resistor ladders are connected in series between high and low potential power sources when the input is differential. When the input is single-ended, the normal phase resistor ladder is connected in series between the high and low potential power sources, and the reversed phase resistor ladder has its ends connected to ground.

The present invention provides an A/D converter which ensures propagation of noise in the normal and reversed phase circuits in the same manner during comparison for cancellation of common mode noise in the differential amplifier, thus preventing accuracy degradation even during high-speed operation.

DETAILED DESCRIPTION OF THE PREFERRED EMBODIMENTS

A description will be given below of embodiments of the present invention with reference to the accompanying drawings. It should be noted that the description will be given in the following order:
1. First embodiment (configuration example of a parallel A/D converter)
2. Second embodiment (configuration example of a serial/parallel A/D converter)<

1. First Embodiment

Configuration Example of a Parallel A/D Converter

Figure 3:
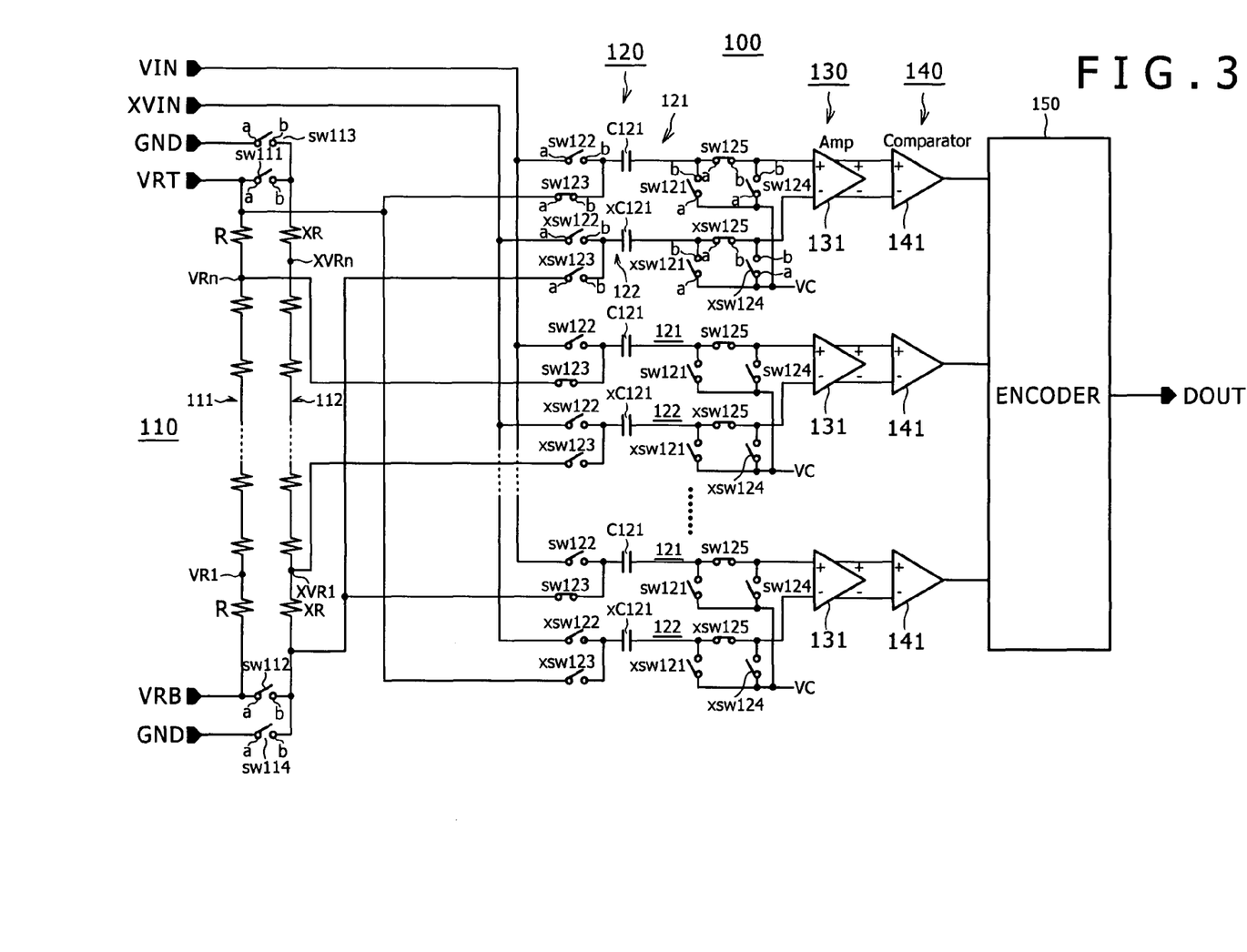
FIG. 3 is a diagram illustrating an example of overall configuration of the parallel A/D converter according to a first embodiment of the present invention.

FIG. 3 is a diagram illustrating an example of overall configuration of a parallel A/D converter according to a first embodiment of the present invention.

A parallel A/D converter 100 includes a reference circuit 110, TH circuit group (track-and-hold circuit group) 120, i.e., normal and reversed phase circuit group, differential amplifier group 130, comparator group 140 and encoder 150.

The reference circuit 110 includes a normal phase resistor ladder 111 and reversed phase resistor ladder 112. The normal phase resistor ladder 111 is made up of a plurality of resistors R adapted to generate reference voltages VR1 to VRn. The reversed phase resistor ladder 112 is made up of a plurality of resistors XR adapted to generate reference voltages XVR1 to XVRn.

When the input is differential, the normal and reversed phase resistor ladders 111 and 112 of the reference circuit 110 are connected in series between the high- and low-potential power sources VRT and VRB.

When the input is single-ended, the normal phase resistor ladder 111 of the reference circuit 110 is connected in series between the high- and low-potential power sources VRT and VRB, and the reversed phase resistor ladder 112 has both of its ends connected to the ground GND.

The reference circuit 110 has first to fourth switches SW111 to SW114 adapted to switch the potential to which the reversed phase resistor ladder 112 is connected between when the input is differential and when the input is single-ended.

The first switch SW111 has its terminal 'a' connected to the high potential power source VRT and its terminal 'b' connected to one end of the reversed phase resistor ladder 112.

The second switch SW112 has its terminal 'a' connected to the low potential power source VRB and its terminal 'b' connected to the other end of the reversed phase resistor ladder 112.

The third switch SW113 has its terminal 'a' connected to the ground GND and its terminal 'b' connected to one end of the reversed phase resistor ladder 112.

The fourth switch SW114 has its terminal 'a' connected to the ground GND and its terminal 'b' connected to the other end of the reversed phase resistor ladder 112.

When the input is differential, the first and second switches SW111 and SW112 are maintained ON, and the third and fourth switches SW113 and SW114 OFF by an unshown control system.

When the input is single-ended, the first and second switches SW111 and SW112 are maintained OFF, and the third and fourth switches SW113 and SW114 ON by an unshown control system.

The TH circuit group 120 includes a plurality of pairs (m pairs) of normal and reversed phase TH circuits 121 and 122. Each pair of the normal and reversed phase TH circuits 121 and 122 is associated with one of the reference voltages including the power source potentials.

When the input is differential and single-ended, the normal phase TH circuit 121 samples a normal phase analog input signal VIN and supplies a comparison voltage, obtained by comparison with the reference voltage generated by the reference circuit 110, to a non-inverted input terminal (+), i.e., a first input terminal, of a differential amplifier 131 at the next stage.

When the input is differential, the reversed phase TH circuit 122 samples a reversed phase analog input signal XVIN and supplies a comparison voltage, obtained by comparison with the reference voltage generated by the reference circuit 110, to an inverted input terminal (−), i.e., a second input terminal, of the differential amplifier 131.

When the input is single-ended, the reversed phase TH circuit 122 samples the ground GND level as a reference voltage of the reference circuit 110 and supplies the reference voltage and comparison voltage to the inverted input terminal (−), i.e., the second input terminal, of the differential amplifier 131.

The normal phase TH circuit 121 includes switches sw121 to sw125 and a capacitor C121.

The switch sw121 has its terminal 'a' connected to the supply line of a voltage VC and its terminal 'b' connected to the terminal 'a' of the switch sw125 and one end (first electrode) of the capacitor C121.

The switch sw122 has its terminal 'a' connected to the supply line of the analog input signal VIN and its terminal 'b' connected to the other end (second electrode) of the capacitor C121 and the terminal 'b' of the switch sw123.

The switch sw123 has its terminal 'a' connected to the associated power source or reference voltage generating point of the normal phase resistor ladder 111.

The switch sw124 has its terminal 'a' connected to the supply line of the voltage VC and its terminal 'b' connected to the terminal 'b' of the switch sw125 and the non-inverted input terminal (+) of the differential amplifier at the next stage.

The reversed phase TH circuit 122 includes switches xsw121 to xsw125 and a capacitor xC121.

The switch xsw121 has its terminal 'a' connected to the supply line of the voltage VC and its terminal 'b' connected to the terminal 'a' of the switch xsw125 and one end (first electrode) of the capacitor xC121.

The switch xsw122 has its terminal 'a' connected to the supply line of the analog input signal VIN and its terminal 'b' connected to the other end (second electrode) of the capacitor xC121 and the terminal 'b' of the switch xsw123.

The switch xsw123 has its terminal 'a' connected to the associated power source, ground or reference voltage generating point of the reversed phase resistor ladder 112.

The switch xsw124 has its terminal 'a' connected to the supply line of the voltage VC and its terminal 'b' connected to the terminal 'b' of the switch xsw125 and the inverted input terminal (+) of the differential amplifier at the next stage.

The differential amplifier group 130 includes m differential amplifiers 131.

Each of the differential amplifiers 131 differentially amplifies the outputs of the associated normal and reversed phase TH circuits 121 and 122.

The comparator group 140 includes a plurality of comparators 141 adapted to compare the outputs of the associated differential amplifier 131 and determine whether to output data "1" or data "0."

The encoder 150 encodes the outputs of the plurality of comparators 141 and outputs digital data with a given number of bits.

A description will be given next of the operation of the A/D converter when the input is differential and single-ended, with primary emphasis on the operation of the reference circuit 110 and normal and reversed phase TH circuits 121 and 122.

Figure 4:
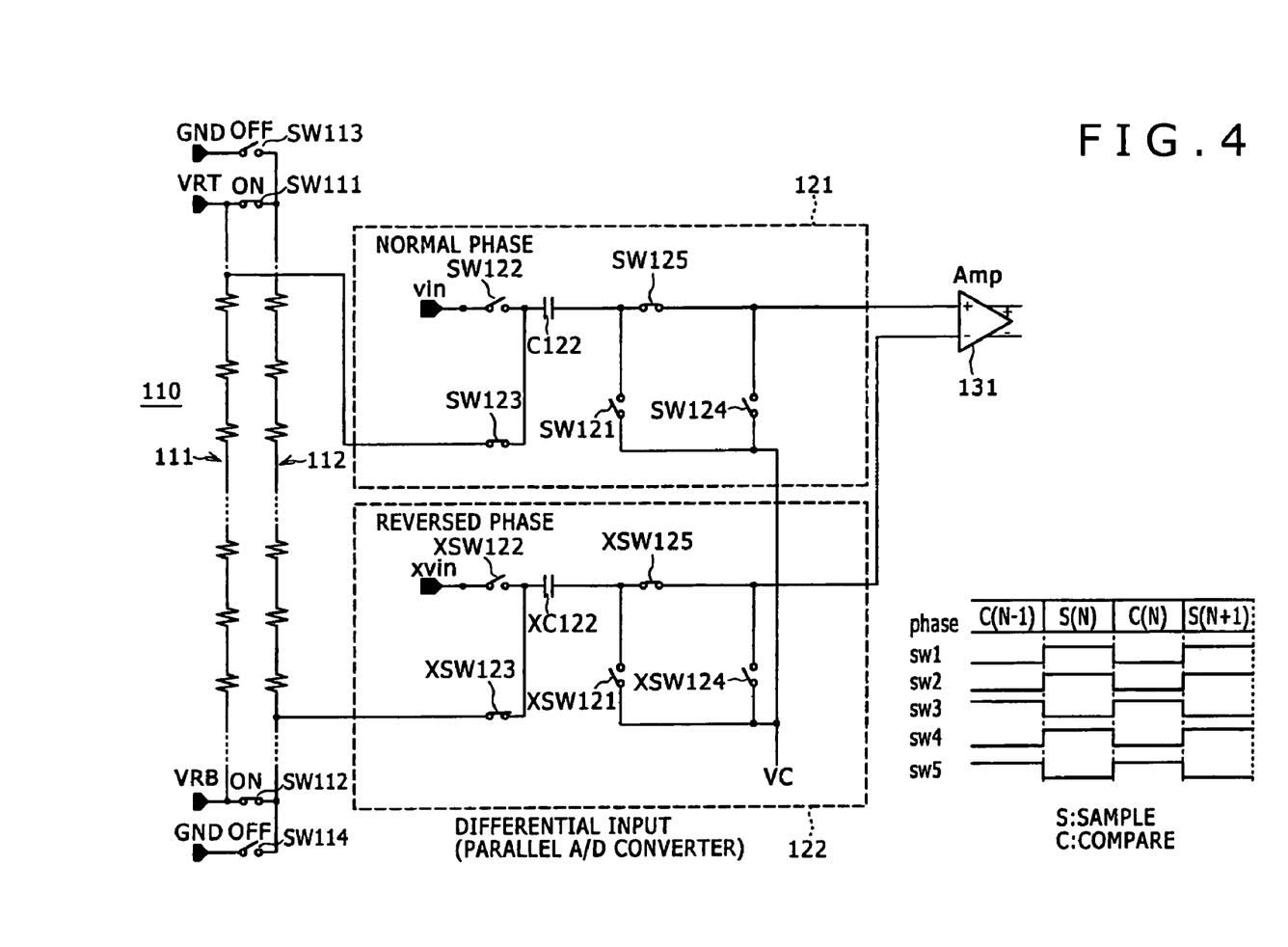
FIG. 4 is a diagram for describing the operation of the parallel A/D converter according to the first embodiment of the present invention when the input is differential.

FIG. 4 is a diagram for describing the operation of the parallel A/D converter according to the first embodiment of the present invention when the input is differential.

Figure 5:
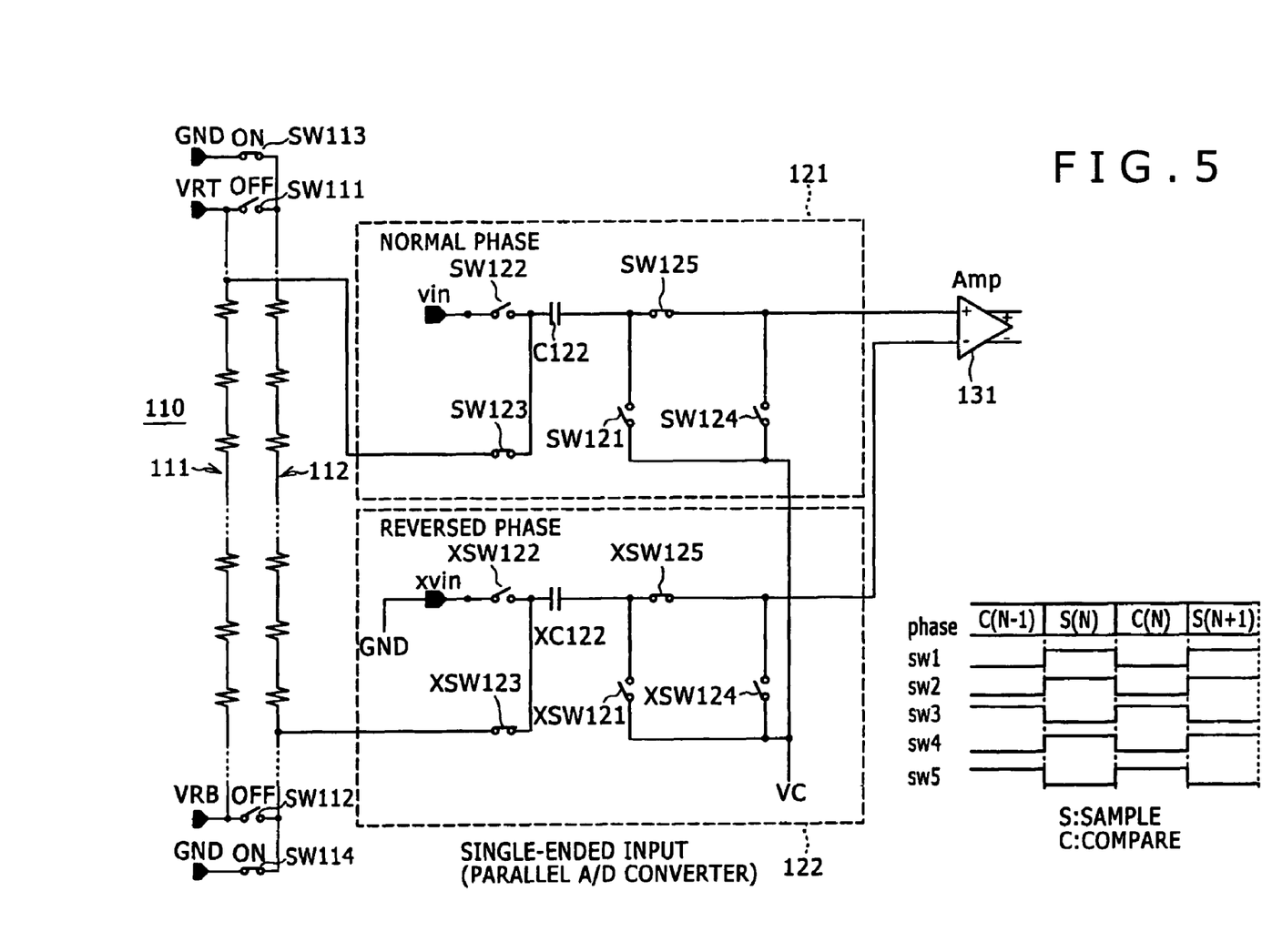
FIG. 5 is a diagram for describing the operation of the parallel A/D converter according to the first embodiment of the present invention when the input is single-ended.

FIG. 5 is a diagram for describing the operation of the parallel A/D converter according to the first embodiment of the present invention when the input is single-ended.

In the parallel A/D converter 100, the first and second switches SW111 and SW112 are maintained ON, and the third and fourth switches SW113 and SW114 OFF by an unshown control system as illustrated in FIG. 4 when the input is differential.

When the input is differential, only the switches SW121, SW122 and SW124 turn ON first, allowing the normal phase TH circuit 121 to sample the analog input signal VIN.

Next, only the switches SW123 and SW125 turn ON, allowing the normal phase TH circuit 121 to transfer a comparison voltage, obtained by comparison with the reference voltage from the reference circuit 110, to the differential amplifier 131 at the subsequent stage.

As with the normal phase TH circuit 121, the reversed phase TH circuit 122 samples the reversed phase analog input signal XVIN and transfers a comparison voltage, obtained by comparison with the reference voltage from the reference circuit 110, to the differential amplifier 131 at the subsequent stage.

At this time, the ends of the reversed phase resistor ladder 112 adapted to generate the reversed phase reference voltage are connected, respectively, to the power sources VRT and VRB, as with those of the normal phase resistor ladder.

In the parallel A/D converter 100, the third and fourth switches SW113 and SW114 are maintained ON, and the first and second switches SW111 and SW112 OFF by an unshown control system as illustrated in FIG. 5 when the input is single-ended.

When the input is single-ended, the reversed phase TH circuit 122 samples the given fixed ground GND and transfers the reference voltage (GND) and comparison voltage to the differential amplifier 131 at the subsequent stage.

At this time, the ends of the reversed phase resistor ladder 112 adapted to generate the reversed phase reference voltage are connected to the ground GND, as a result of switching by the switches as described above.

As a result, the impedance of the reference circuit 110 as seen from the normal phase TH circuit 121 is equal to that as seen from the reversed phase TH circuit 122, thus providing the same frequency band for the two circuits.

This allows for noise propagated from the reference circuit 110 to be cancelled out by the differential amplifier 131 as common-mode noise.

As described above, the parallel A/D converter 100 according to the first embodiment includes the reference circuit 110 adapted to generate the reference voltages, the differential amplifier 131 and normal and reversed phase TH circuits 121 and 122.

When the input is differential and single-ended, the normal phase TH circuit 121 samples the normal phase analog input signal VIN and supplies a comparison voltage, obtained by comparison with the reference voltage from the reference circuit 110, to the first input terminal of the differential amplifier 131.

When the input is differential, the reversed phase TH circuit 122 samples the reversed phase analog input signal XVIN and supplies a comparison voltage, obtained by comparison with the reference voltage from the reference circuit 110, to the second input terminal of the differential amplifier 131.

When the input is single-ended, the reversed phase TH circuit 122 samples the ground GND level as a reference voltage of the reference circuit 110 and supplies the reference voltage and comparison voltage to the second input terminal of the differential amplifier 131.

The reference circuit 110 includes the normal and reversed phase resistor ladders 111 and 112, each made up of a plurality of resistors.

When the input is differential, the same resistor ladders 111 and 112 of the reference circuit 110 are connected in series between the high and low potential power sources VRT and VRB.

When the input is single-ended, the normal phase resistor ladders 111 is connected in series between the high and low potential power sources VRT and VRB, and the reversed phase resistor ladder 112 has its both ends connected to the ground GND.

Thus, the first embodiment provides an A/D converter which ensures propagation of noise in the same manner in the normal and reversed phase circuits during comparison for cancellation of common mode noise in the differential amplifier so as to prevent accuracy degradation even during high-speed operation.

This permits high-speed operation with a single-ended input comparable to that with a differential input.

Further, the above reference circuit configuration is applicable not only to a parallel A/D converter but also to a serial/parallel A/D converter.

2. Second Embodiment

Figure 6:
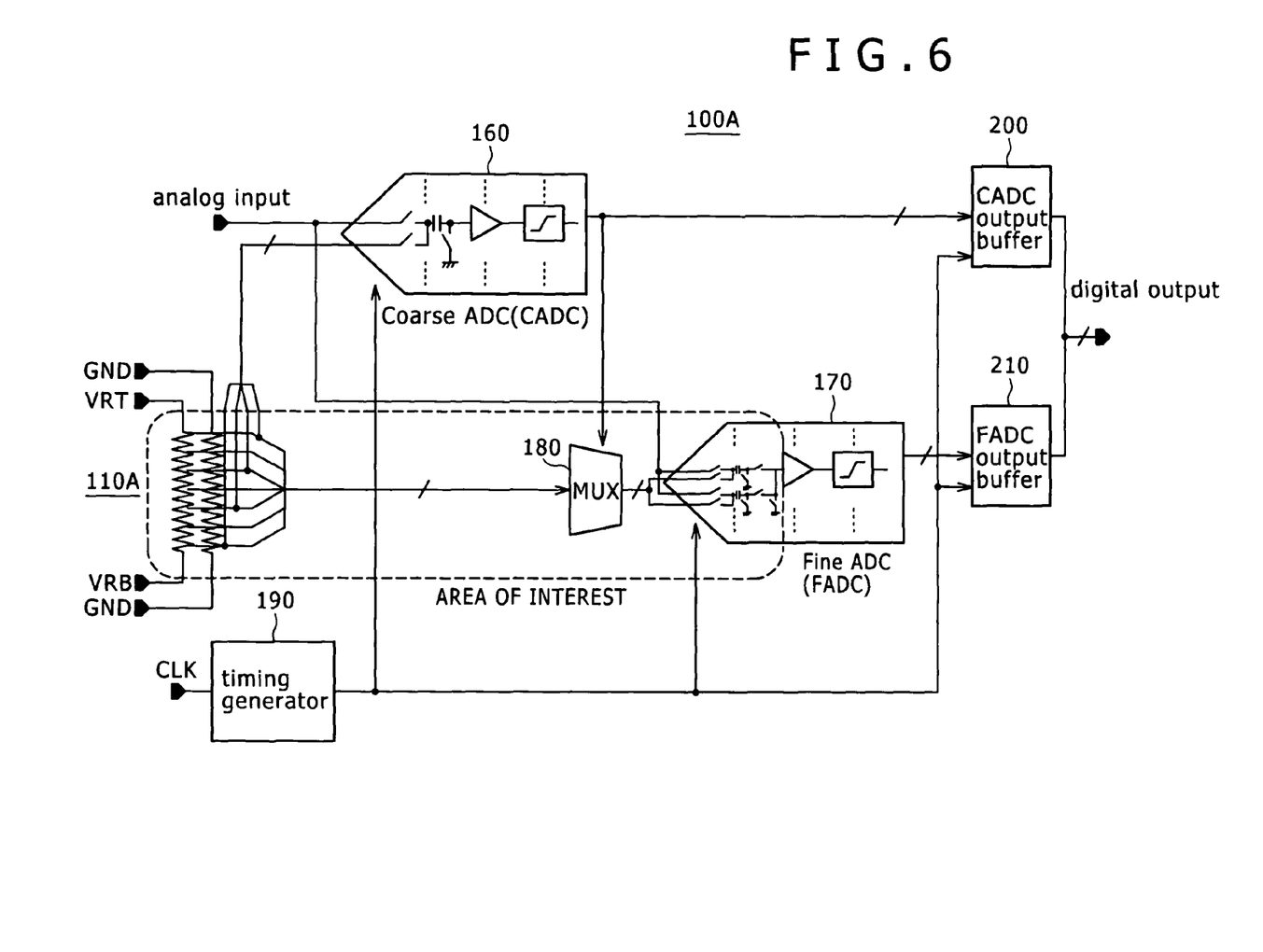
FIG. 6 is a diagram illustrating an example of overall configuration of a serial/parallel A/D converter according to a second embodiment of the present invention.

FIG. 6 is a diagram illustrating the overall configuration of a serial/parallel A/D converter according to a second embodiment of the present invention.

As illustrated in FIG. 6, a serial/parallel A/D converter 100A includes a coarse ADC (CADC) 160 adapted to convert an analog input voltage to a higher-order m-bit digital signal during conversion of the analog input voltage to an N-bit digital signal.

The serial/parallel A/D converter 100A further includes a fine ADC (FADC) 170 adapted to convert the analog input voltage to a lower-order n-bit (n=N−m) digital signal.

The serial/parallel A/D converter 100A still further includes a reference circuit 110A adapted to supply a reference voltage during A/D conversion of the CADC 160 and FADC 170.

The serial/parallel A/D converter 100A still further includes a multiplexer 180 and timing generator 190. The multiplexer 180 includes a plurality of switches (matrix switches) arranged in a matrix form. The timing generator 190 controls the timings of all the circuits.

The serial/parallel A/D converter 100A still further includes an output buffer 200 of the CADC 160 and an output buffer 210 of the FADC 170.

The reference circuit 110A is basically configured in the same manner as the reference circuit 110 according to the first embodiment.

In the serial/parallel A/D converter 100A, the analog input signal VIN is converted to a higher-order m-bit digital signal by the CADC 160. The reference circuit 110A determines the reference voltage to be supplied to the FADC 170 according to the conversion result. The FADC 170 converts the analog input signal VIN to a lower-order n-bit digital signal based on the reference voltage supplied.

Figure 7:
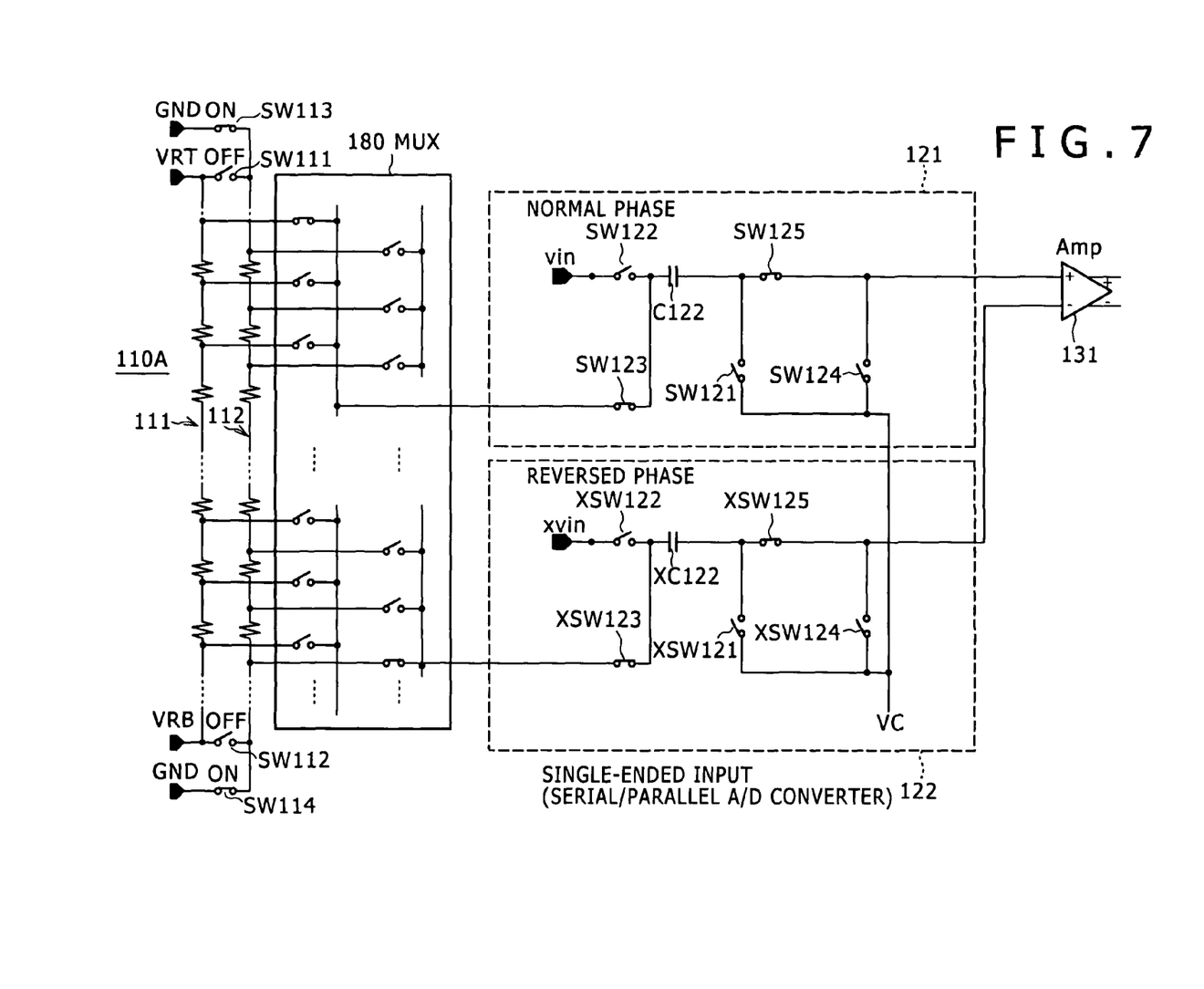
FIG. 7 is a diagram schematically illustrating a reference circuit, multiplexer and normal and reversed phase TH circuits of a FADC of the serial/parallel A/D converter according to the second embodiment of the present invention.

FIG. 7 is a diagram schematically illustrating the reference circuit, multiplexer and normal and reversed phase TH circuits of the FADC of the serial/parallel A/D converter according to the second embodiment of the present invention.

In order to facilitate the understanding, the serial/parallel A/D converter 100A is shown in FIG. 7 to have a configuration in which the multiplexer 180 is added to the parallel A/D converter 100 according to the first embodiment illustrated in FIGS. 4 and 5.

In the case of the serial/parallel A/D converter 100A, the matrix switches are operated together with the normal phase TH circuit 121 to eliminate the difference in impedance, i.e., difference in frequency band, thus ensuring propagation of noise in the same manner in the two TH circuits during comparison.

This allows for the noise to be cancelled out by the differential amplifier 131 as common-mode noise, thus preventing characteristic degradation of the A/D converter even during high-speed operation.

More specifically, when the input is single-ended, the ends of the reversed phase resistor ladder 112 adapted to generate reference voltages are connected to the ground GND as illustrated in FIG. 7 as a result of switching by the switches as for the parallel A/D converter 100.

As a result, the impedance of the reference circuit 110 as seen from the normal phase TH circuit 121 is equal to that as seen from the reversed phase TH circuit 122, thus providing the same frequency band for the two circuits.

This allows for noise propagated from the reference circuit 110A to be cancelled out by the differential amplifier 131 as common-mode noise.

At this time, both the normal and reversed phase switches are operated. These switches are inserted in series with the reference circuit 110A to change the reference voltages to be supplied according to the conversion result of the CADC 160.

Figure 8:
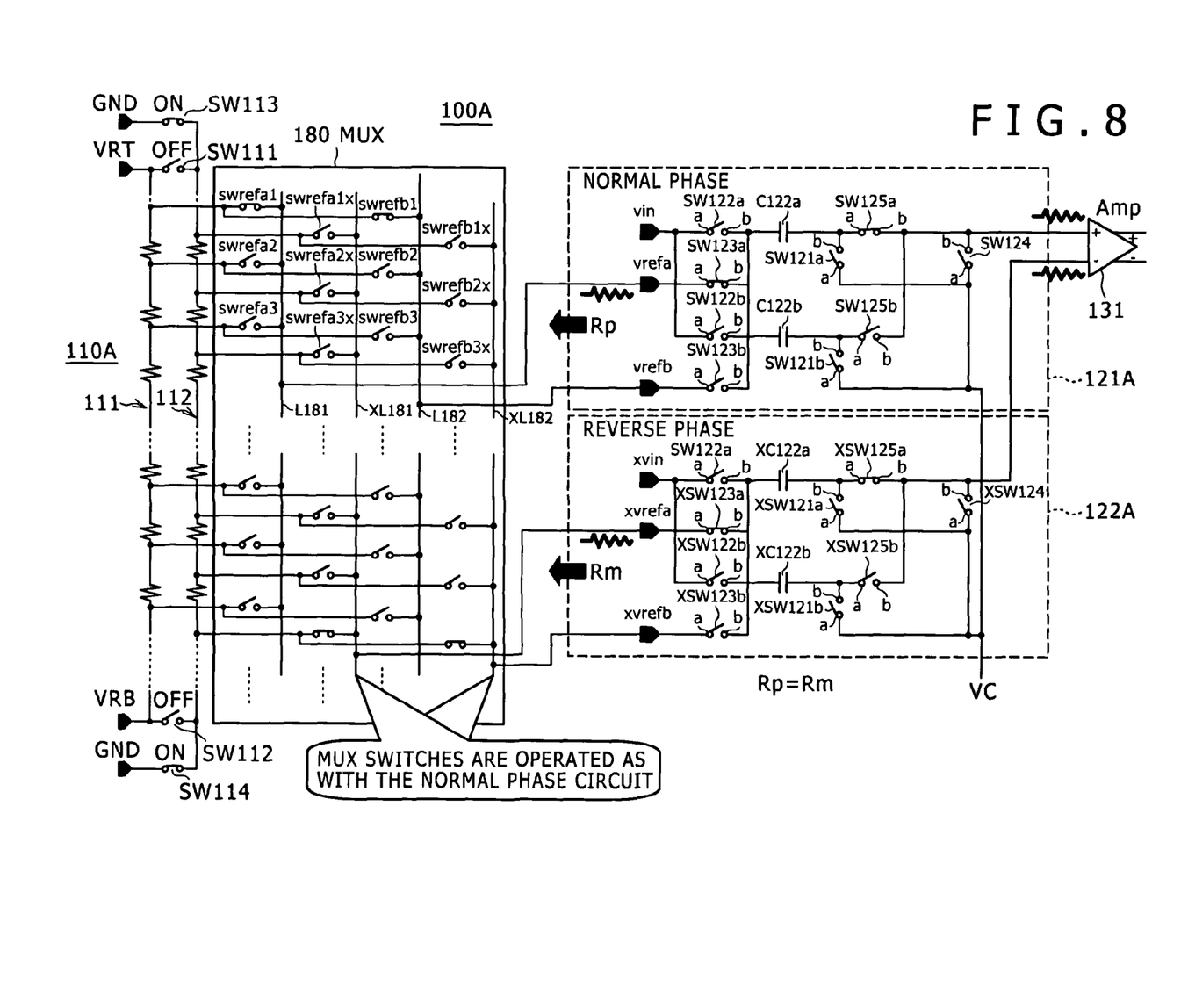
FIG. 8 is a diagram specifically illustrating the reference circuit, multiplexer and normal and reversed phase TH circuits of the FADC of the serial/parallel A/D converter according to the second embodiment of the present invention.

FIG. 8 is a diagram specifically illustrating the reference circuit, multiplexer and normal and reversed phase TH circuits of the FADC of the serial/parallel A/D converter according to the second embodiment of the present invention.

The multiplexer 180 includes two normal phase lines L181 and L182 and two reversed phase lines XL181 and XL182.

The normal phase line L181 is operationally connected to the generating points of the reference voltages of the normal phase resistor ladder 111 including the power source potentials via matrix switches swrefa1, swrefa2, swrefa3 and so on.

The normal phase line L182 is operationally connected to the generating points of the reference voltages of the normal phase resistor ladder 111 including the power source potentials via matrix switches swrefb1, swrefb2, swrefb3 and so on.

These normal phase lines L181 and L182 are connected to a normal phase TH circuit 121A.

The reversed phase line XL181 is operationally connected to the generating points of the reference voltages of the reversed phase resistor ladder 112 including the power source potentials via matrix switches swrefa1$x$, swrefa2$x$, swrefa3$x$ and so on.

The reversed phase line XL182 is operationally connected to the generating points of the reference voltages of the reversed phase resistor ladder 112 including the power source potentials via matrix switches swrefb1$x$, swrefb2$x$, swrefb3$x$ and so on.

These reversed phase lines XL181 and XL182 are connected to a reversed phase TH circuit 122A.

The normal phase TH circuit 121A includes the same switches and capacitor as the normal phase TH circuit 121 according to the first embodiment except that all the switches and capacitor other than the switch SW124 are paired.

The normal phase TH circuit 121A includes switches SW121$a$, SW121$b$, SW122$a$, SW122$b$, SW123$a$, SW123$b$, SW124, SW125$a$ and SW125$b$ and capacitors C122$a$ and C122$b$.

The switch SW121$a$ has its terminal 'a' connected to the supply line of the voltage VC and its terminal 'b' connected to the terminal 'a' of the switch SW125$a$ and one end (first electrode) of the capacitor C122$a$.

The switch SW122$a$ has its terminal 'a' connected to the supply line of the analog input signal VIN and its terminal 'b' connected to the other end (second electrode) of the capacitor C122$a$ and the terminal 'b' of the switch SW123$a$.

The switch SW123$a$ has its terminal 'a' connected to the normal phase line L181.

The switch SW124$a$ has its terminal 'a' connected to the supply line of the voltage VC and its terminal 'b' connected to the terminal 'b' of the switch SW125$a$ and the non-inverted input terminal (+) of the differential amplifier 131 at the next stage.

The switch SW121$b$ has its terminal 'a' connected to the supply line of the voltage VC and its terminal 'b' connected to the terminal 'a' of the switch SW125$b$ and one end (first electrode) of the capacitor C122$b$.

The switch SW122$b$ has its terminal 'a' connected to the supply line of the analog input voltage VIN and its terminal 'b' connected to the other end (second electrode) of the capacitor C122$b$ and the terminal 'b' of the switch SW123$b$.

The switch SW123$b$ has its terminal 'a' connected to the normal phase line L182.

The reversed phase TH circuit 122A includes the same switches and capacitor as the reversed phase TH circuit 122 according to the first embodiment except that all the switches and capacitor other than the switch XSW124 are paired.

The reversed phase TH circuit 122A includes switches XSW121a, XSW121b, XSW122a, XSW122b, XSW123a, XSW123b, XSW124, XSW125a and XSW125b and capacitors XC122a and XC122b.

The switch XSW121a has its terminal 'a' connected to the supply line of the voltage VC and its terminal 'b' connected to the terminal 'a' of the switch XSW125a and one end (first electrode) of the capacitor XC122a.

The switch XSW122a has its terminal 'a' connected to the supply line of the analog input signal XVIN and its terminal 'b' connected to the other end (second electrode) of the capacitor XC122a and the terminal 'b' of the switch XSW123a.

The switch XSW123a has its terminal 'a' connected to the reversed phase line XL181.

The switch XSW124a has its terminal 'a' connected to the supply line of the voltage VC and its terminal 'b' connected to the terminal 'b' of the switch XSW125a and the inverted input terminal (−) of the differential amplifier 131 at the next stage.

The switch XSW121b has its terminal 'a' connected to the supply line of the voltage VC and its terminal 'b' connected to the terminal 'a' of the switch XSW125b and one end (first electrode) of the capacitor XC122b.

The switch XSW122b has its terminal 'a' connected to the supply line of the analog input voltage XVIN and its terminal 'b' connected to the other end (second electrode) of the capacitor XC122b and the terminal 'b' of the switch XSW123b.

The switch XSW123b has its terminal 'a' connected to the reversed phase line XL182.

Figure 9:
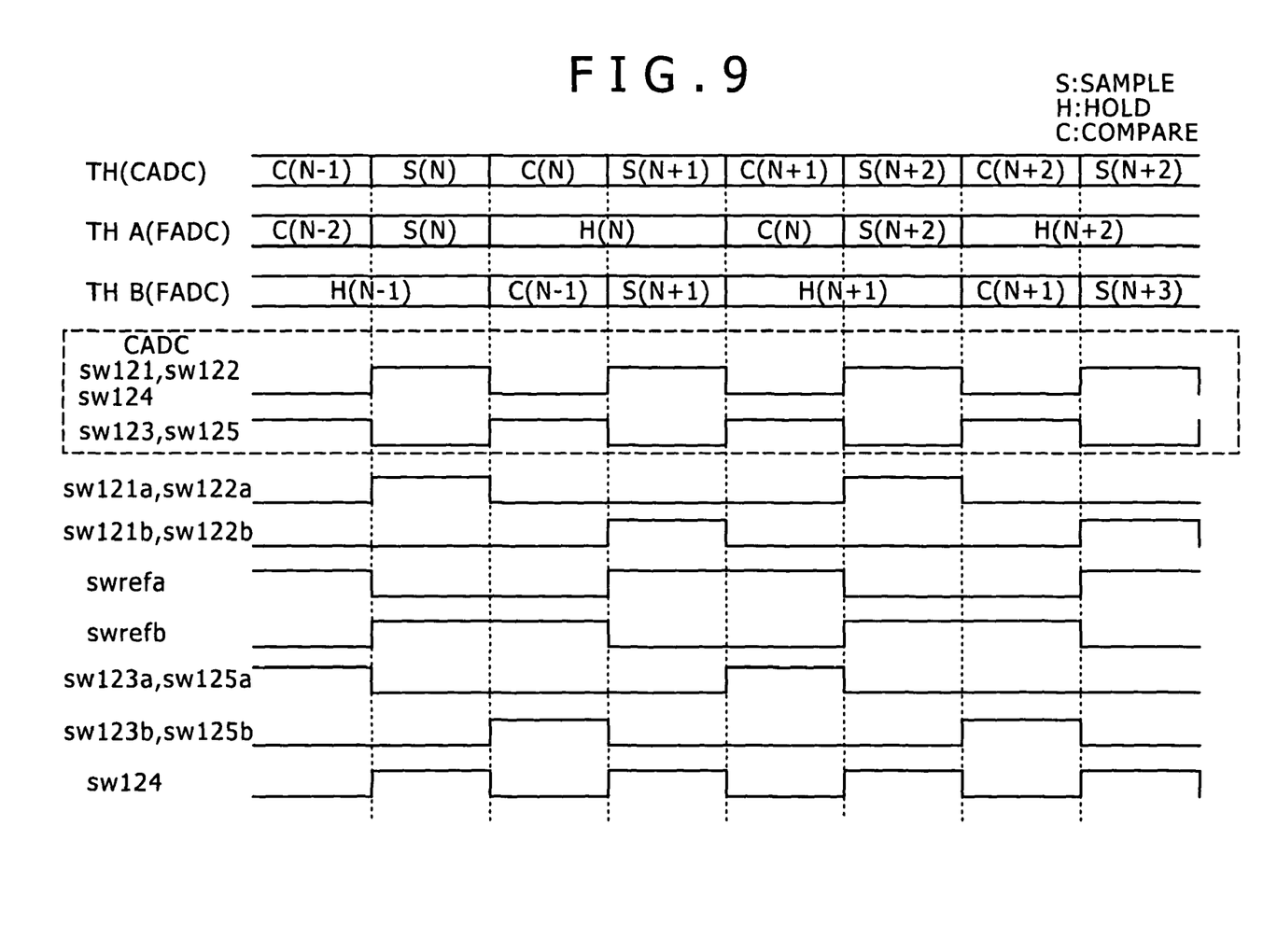
FIG. 9 is a timing diagram of the circuit shown in FIG. 8.

FIG. 9 is a timing diagram of the circuit shown in FIG. 8.

The serial/parallel A/D shown in FIG. 8 basically operates in the same manner as the parallel A/D converter shown in FIGS. 4 and 5.

In the serial/parallel A/D converter 100A, the first and second switches SW111 and SW112 are maintained ON, and the third and fourth switches SW113 and SW114 OFF by an unshown control system when the input is differential.

When the input is differential, only the switches SW121a, SW122a and SW124a turn ON first, allowing the normal phase TH circuit 121A to sample the analog input signal VIN.

Next, only the switches SW123a and SW125a turn ON, allowing the normal phase TH circuit 121A to transfer a comparison voltage, obtained by comparison with a reference voltage vrefa transferred from the reference circuit 110A to the normal phase line L181, to the differential amplifier 131 at the subsequent stage.

Next, when the input is differential, only the switches SW121b, SW122b and SW124b turn ON first, allowing the normal phase TH circuit 121A to sample the analog input signal VIN.

Next, only the switches SW123b and SW125b turn ON, allowing the normal phase TH circuit 121A to transfer a comparison voltage, obtained by comparison with a reference voltage vrefb transferred from the reference circuit 110A to the normal phase line L182, to the differential amplifier 131 at the subsequent stage.

As with the normal phase TH circuit 121A, the reversed phase TH circuit 122A samples the analog input signal XVIN and transfers the comparison voltage, obtained by comparison with the reference voltage from the reference circuit 110A, to the differential amplifier 131 at the subsequent stage.

At this time, the ends of the reversed phase resistor ladder 112 adapted to generate the reversed phase reference voltages are connected, respectively, to the power sources VRT and VRB, as with those of the normal phase resistor ladder.

In the parallel A/D converter 100A, the third and fourth switches SW113 and SW114 are maintained ON, and the first and second switches SW111 and SW112 OFF by an unshown control system as illustrated in FIG. 8 when the input is single-ended.

When the input is single-ended, the reversed phase TH circuit 122A samples the given fixed ground GND of the reference circuit 110A connected via the reversed phase lines XL181 and XL182 and transfers the reference voltage (GND) and comparison voltage to the differential amplifier 131 at the subsequent stage.

At this time, the ends of the reversed phase resistor ladder 112 adapted to generate the reversed phase reference voltages are connected to the ground GND, as a result of switching by the switches as described above.

As a result, the impedance of the reference circuit 110A as seen from the normal phase TH circuit 121A is equal to that as seen from the reversed phase TH circuit 122A, thus providing the same frequency band for the two circuits.

This allows for noise propagated from the reference circuit 110A to be cancelled out by the differential amplifier 131 at the subsequent stage as common-mode noise.

The second embodiment provides the same advantageous effects as the first embodiment.

Figure 10:
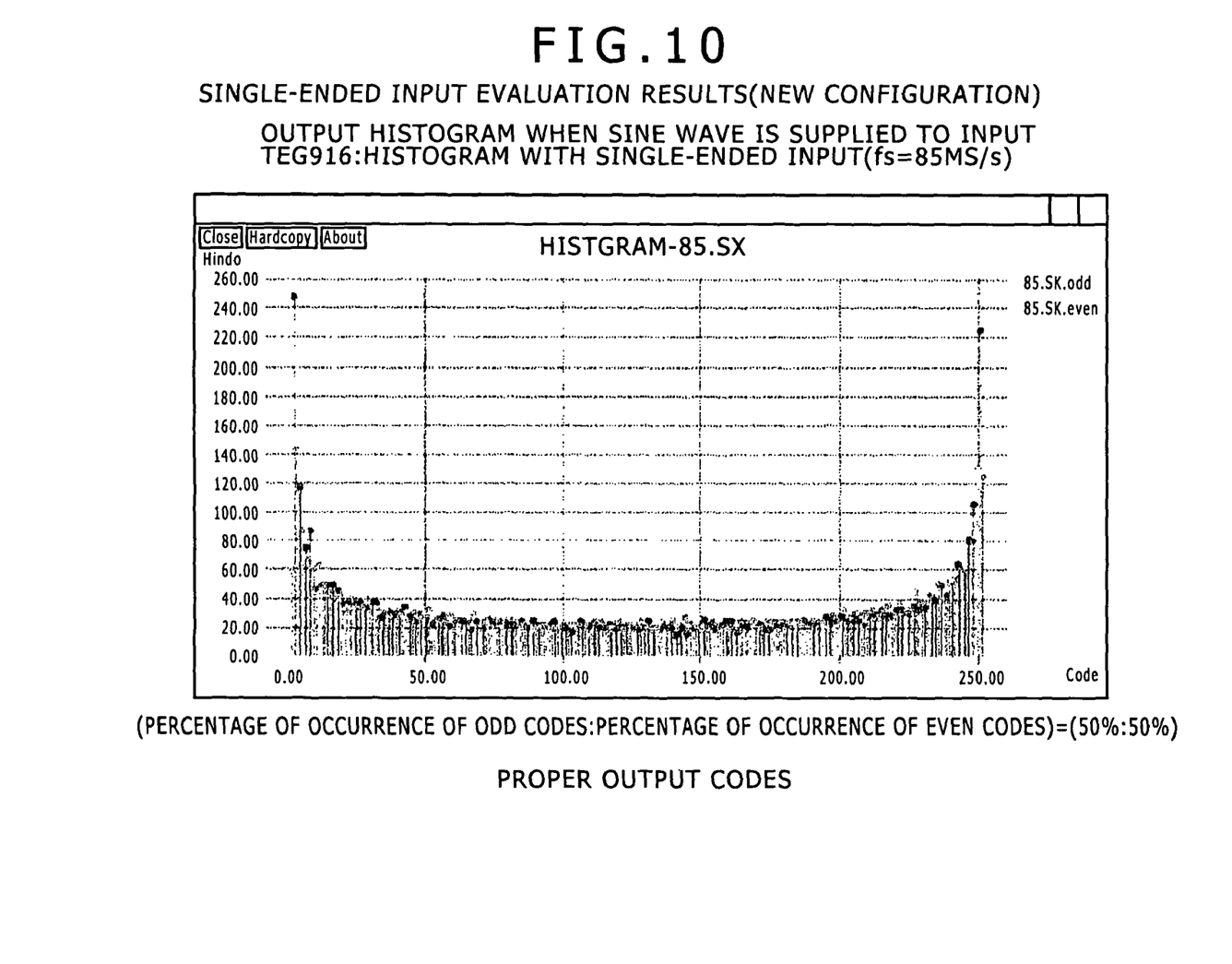
FIG. 10 is a diagram illustrating the evaluation results of the operation of the A/D converter according to the present embodiment when the input is single-ended.
Figure 11:
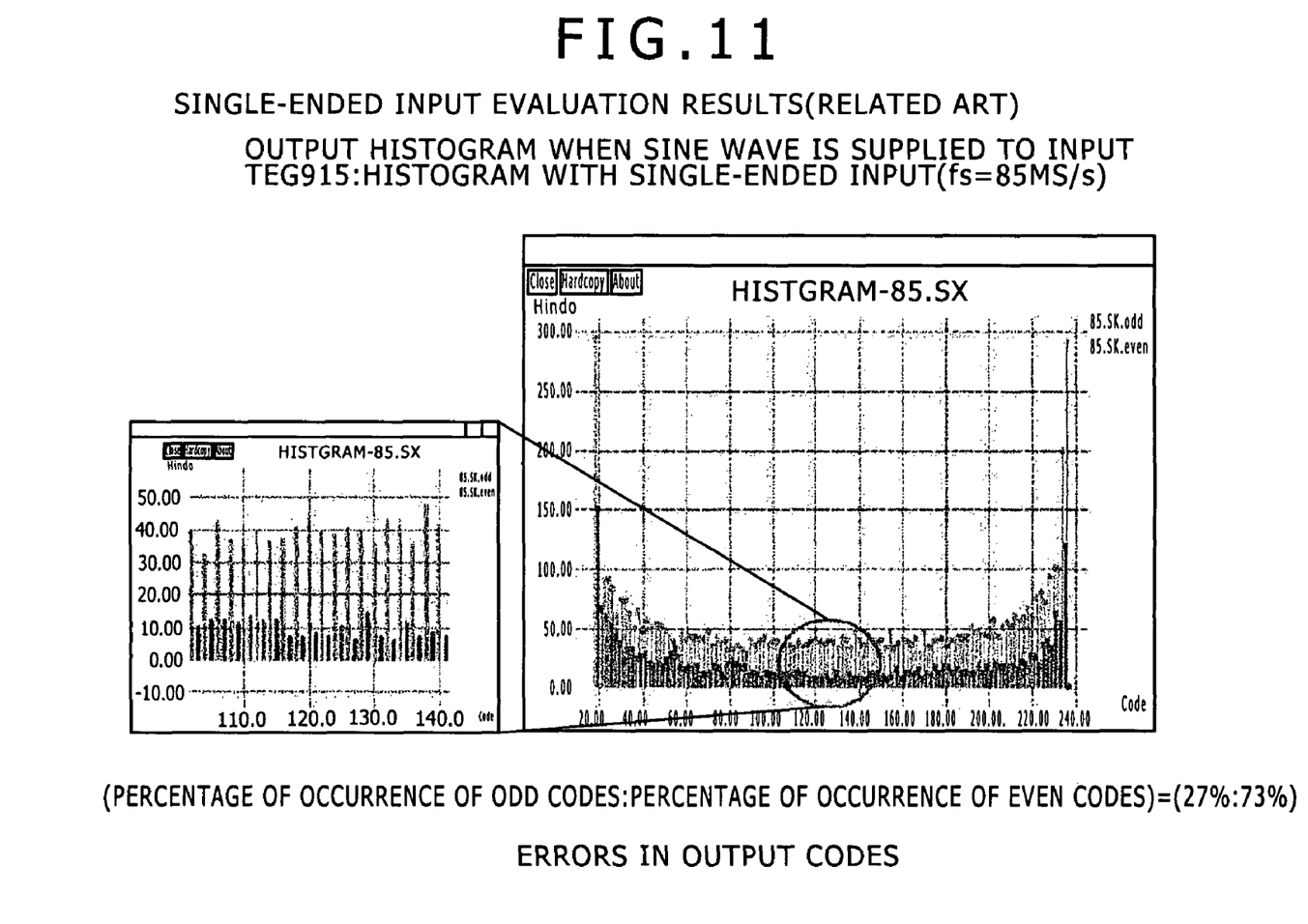
FIG. 11 is a diagram illustrating the evaluation results of the operation of a common A/D converter as a comparative example when the input is single-ended.

FIGS. 10 and 11 are diagrams illustrating the evaluation results of the A/D converter operation when the input is single-ended.

FIG. 10 illustrates the evaluation results of the A/D converter according to the embodiments of the present invention, and FIG. 11 the evaluation results of a common A/D converter as a comparative example.

These evaluations produced output histograms when a sine wave was supplied to the input.

As illustrated in FIG. 10, the A/D converter according to the present embodiment generated proper output codes.

In contrast, errors occurred in the output codes generated by the A/D converter according to the comparative example.

The present application contains subject matter related to that disclosed in Japanese Priority Patent Application JP 2009-105287 filed in the Japan Patent Office on Apr. 23, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An analog to digital converter comprising:
    a ladder of reverse phase resistors, said reverse phase resistors being electrically connected in series between a first end of the ladder and a second end of the ladder;
    a reverse phase circuit configured to output a reverse phase comparison voltage to a differential amplifier, said reverse phase comparison voltage being generated from a reverse phase analog input signal and a reverse phase reference voltage,
    wherein, when input to said differential amplifier is single-ended, said first and second ends and said reverse phase analog input signal are configured to be electrically connected to ground.

2. The analog to digital converter of claim 1, wherein when said input is differential, said first end is configured to be electrically connected to a high potential power source and second end is configured to be electrically connected to a low potential power source.

3. The analog to digital converter of claim 2, wherein when said input is said differential, a first switch is configured to electrically connect said first end to said high potential power source and a second switch is configured to electrically connect said second end to said low potential power source.

4. The analog to digital converter of claim 3, wherein said first end is electrically connected to said first switch and a third switch, said second end being electrically connected to second switch and a fourth switch.

5. The analog to digital converter of claim 4, wherein when said input is said single-ended, said third switch is configured to electrically connect said first end to said ground and said fourth switch is configured to electrically connect said second end to said ground.

6. The analog to digital converter of claim 2, further comprising:
a ladder of normal phase resistors, said normal phase resistors being electrically connected in series between said high potential power source and said low potential power source.

7. The analog to digital converter of claim 6, further comprising:
a normal phase circuit configured to output a normal phase comparison voltage to said differential amplifier, said normal phase comparison voltage being generated from a normal phase analog input signal and a normal phase reference voltage.

8. The analog to digital converter of claim 7, wherein a first input terminal of the differential amplifier receives said normal phase comparison voltage, a second input terminal the differential amplifier receiving said reverse phase comparison voltage.

9. The analog to digital converter of claim 7, further comprising:
a multiplexer between said normal and reverse phase circuits and a reference circuit, said reference circuit being said normal phase resistors and reverse phase resistors.

10. The analog to digital converter of claim 9, wherein said normal phase reference voltage is an output from a terminal for one of the normal phase resistors, said normal phase line being electrically connected to a reference voltage input section of said normal phase circuit.

11. The analog to digital converter of claim 10, wherein a normal phase line is electrically connected to said terminal for one of the normal phase resistors.

12. The analog to digital converter of claim 9, wherein said reverse phase reference voltage is an output from a terminal for one of the reverse phase resistors, said reverse phase line being electrically connected to a reference voltage input section of said reverse phase circuit.

13. The analog to digital converter of claim 12, wherein a reverse phase line is electrically connected to said terminal for one of the reverse phase resistors.

14. The analog to digital converter of claim 9, further comprising:
a coarse analog-to-digital converter configured to convert an analog input voltage to a higher-order m-bit digital signal during conversion of the analog input voltage to an N-bit digital signal; and
a fine analog-to-digital converter configured to convert said analog input voltage to a lower-order n-bit (n=N−m) digital signal.

15. The analog to digital converter of claim 14, wherein said reference circuit supplies a reference voltage during analog to digital conversion of the coarse and fine analog-to-digital converters.

16. The analog to digital converter of claim 14, wherein said fine analog-to-digital converter includes said normal and reversed phase circuits.

17. The analog to digital converter of claim 14, wherein said multiplexer is provided between a reference voltage supply line of the reference circuit and the normal and reversed phase circuits of said fine analog-to-digital converter.

18. The analog to digital converter of claim 14, wherein the reference circuit determines the reference voltage to be supplied to said fine analog-to-digital converter according to the result of conversion of the input signal to a higher-order m-bit digital signal by the coarse analog-to-digital converter.

19. The analog to digital converter of claim 14, wherein said fine analog-to-digital converter converts the input signal to a lower-order n-bit digital signal based on the reference voltage supplied.

* * * * *